US006816420B1

(12) United States Patent
Liu et al.

(10) Patent No.: US 6,816,420 B1
(45) Date of Patent: Nov. 9, 2004

(54) COLUMN REDUNDANCY SCHEME FOR SERIALLY PROGRAMMABLE INTEGRATED CIRCUITS

(75) Inventors: Ping-Chen Liu, Fremont, CA (US); Asim A. Bajwa, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/629,109

(22) Filed: Jul. 29, 2003

(51) Int. Cl.$^7$ ................................................ G11C 7/00
(52) U.S. Cl. ............ 365/200; 365/189.02; 365/189.05; 365/189.12
(58) Field of Search ........................... 365/200, 189.02, 365/189.05, 189.12, 221

(56) References Cited

U.S. PATENT DOCUMENTS

| | | | | |
|---|---|---|---|---|
| 4,598,388 A | * | 7/1986 | Anderson | 365/200 |
| 5,889,504 A | * | 3/1999 | Kihara et al. | 345/100 |
| 6,496,431 B1 | * | 12/2002 | Nakahara et al. | 365/200 |
| 6,711,056 B2 | * | 3/2004 | Abedifard et al. | 365/185.09 |

OTHER PUBLICATIONS

Institute of Electrical and Electronics Engineering, Inc., "IEEE Standard Test Access Port and Boundary–Scan Architecture," IEEE Std 1149.1–1990 (Includes IEEE Std 1149.1a–1993), Oct. 21, 1993, pp. 1–172, ISBN 1–55937–350–4, available from Institute of Electrical and Electronics Engineering, Inc., 345 East 47th Street, New York, NY 10017–2394.

U.S. patent application Ser. No. 10/629,365, Bajwa et al., filed Jul. 29, 2003.

* cited by examiner

Primary Examiner—Son T. Dinh
(74) Attorney, Agent, or Firm—John Kubodera; Edel M. Young; Justin Liu

(57) ABSTRACT

A serially programmable integrated circuit (IC) includes a memory array and multiple data registers daisy-chained by bypass logic. Each of the data registers is associated with a primary column grouping or redundant column grouping in the memory array. If a data register is associated with a primary column grouping that includes a defective column, the bypass logic bypasses that data register and incorporates one of the data registers associated with a redundant column grouping into the serial programming path of the IC. Therefore, when a programming bitstream is shifted into this serial programming path, defective columns in the memory array are automatically bypassed during the subsequent programming operation. To read a word from the memory array, any data stored in the redundant columns is first read out, and then the data from the primary columns is read out, bypassing the previously identified defective column groupings.

25 Claims, 9 Drawing Sheets

COLUMN REDUNDANCY SCHEME FOR SERIALLY PROGRAMMABLE INTEGRATED CIRCUITS

FIELD OF THE INVENTION

The present invention relates to the field of serially programmable devices, and in particular to a method and apparatus for incorporating column redundancy into a serially programmable device.

BACKGROUND OF THE INVENTION

To reduce pin count in an integrated circuit (IC), serial programming is often used. Because serial programming data is loaded into the IC in a continuous stream, only a single data input pin is required for programming. Typically, the programming data is loaded into a shift register within the IC. FIG. 1 shows a cascaded shift register 100 that has a typical register structure for a serially programmable IC. Shift register 100 includes flip flops 111, 112, 113, and 114, each of which includes an input terminal D, an output terminal Q, and a clock terminal CK. Output terminal Q of flip flop 111 is connected to input terminal D of flip flop 112, output terminal Q of flip flop 112 is connected to input terminal D of flip flop 113, and output terminal Q of flip flop 113 is connected to input terminal D of flip flop 114 to form the cascaded structure. Meanwhile, each clock terminal CK of flip-flops 111–114 is coupled to receive a clock signal CLOCK.

on each pulse of clock signal CLOCK, an input data value DIN is loaded into flip flop 111, the data previously stored in flip flop 111 is loaded into flip flop 112, the data previously stored in flip flop 112 is loaded into flip flop 113, and the data previously stored in flip flop 113 is loaded into flip flop 114. The data previously stored in flip-flop 114 is provided as an output data value DOUT. In this manner, serial data is shifted into (and out of) shift register 100. The data stored in shift register 100 can also be read out in parallel from the output terminal Qs of each of flip flops 111–114, as data values Q1–Q4, respectively.

Serially programmed memory ICs use this serial-in-parallel-out (SIPO) capability of a cascaded shift register to improve programming efficiency. In a typical non-volatile memory IC such as an electrically erasable programmable read only memory (EEPROM) or a FLASH memory, programming an individual memory cell in a memory array (typically using Fowler-Nordheim tunneling and/or channel hot electron injection) takes much longer than shifting data into a shift register. For example, 14 ms might be required to program a memory cell in an EEPROM or FLASH memory (using Fowler-Nordheim tunneling). In contrast, filling a shift register with new data only requires a number of clock cycles equal to the number of flip flops in the shift register—e.g., if the system clock is running at 22 MHz and the shift register is a 4096-bit shift register, filling the shift register would only require 0.19 ms (=$4096/22 \times 10^6$) Therefore, to minimize programming time, serial data is shifted into the shift register, and the contents of the shift register are then programmed into a particular address of the memory array as a single word. Since the memory cell programming for an entire row of the memory array can be performed in parallel, this "page mode" programming technique can significantly reduce overall programming time.

FIG. 2 shows a conventional serially programmable memory IC 200 that includes an input terminal 201, a register output terminal 202, a data register 210 connected between input terminal 201 and register output terminal 202, a bitline latch 211, a M×N memory array 220, sense amplifiers 231, a data latch 232, a bit shifting multiplexer 233, and an output terminal 203. M×N memory array 220 is made up of M rows (i.e., rows W0 through WM-1) and N columns (i.e., columns C0 through CN-1) of memory cells. To program a row of memory array 220, a programming bitstream DIN is shifted into data register 210 via input terminal 201. Data register 210 provides a serial programming path for IC 200—i.e., a data path into which a programming bitstream can be serially loaded, prior to a parallel programming operation. Once data register 210 is filled, the stored bitstream is loaded into bitline latch 211, after which the latched data is programmed into a selected row of memory array 220 in a page mode programming operation. To read out a word from memory array 220, the selected word data is latched into data latch 232 via sense amplifiers 231, and the latched data is then shifted out of output terminal 203 as a serial output data stream DOUT by bit shifting multiplexer 233. In this manner, the number of data input and output pins required by IC 200 can be minimized.

However, as memory arrays continue to increase in size, the denser memory structures become more susceptible to memory defects (such as a column short, bad trace, etc.). Therefore, to maintain a high production yield, it becomes increasingly desirable to provide redundancy in a memory array—i.e., include extra columns that can be used to replace defective columns. In the absence of such redundancy, a single bad memory cell can render an entire memory array unusable. Conventionally addressed memory arrays incorporate such redundant columns by simply addressing the appropriate redundant column instead of the defective column. However, in conventional serially programmable memory arrays, this type of random access is not available, making redundancy extremely difficult to incorporate.

For example, in FIG. 2, columns CN-1 and CN-2 could be redundant columns to be used if there are defects in any of columns C0 through CN-3 (which would then represent the "primary memory region" of memory array 220—i.e., the portion of memory array 220 in which data would be stored in the absence of array defects). In such an arrangement, replacing a defective column with column CN-1 would require that the flip flop in data register 210 associated with column CN-1 receive the data originally intended for the flip flop associated with the defective column. However, the flip-flops in a shift register (i.e., data register 210) are hardwired in a predetermined order, and so cannot be easily reordered to incorporate the redundant column in place of the defective column.

To overcome this limitation, conventional ICs sometimes include redundancy logic that counts clock cycles as data is shifted into the shift register. The redundancy logic uses the clock counts to determine whether a particular data bit is associated with a defective column, and if so, transfers that data bit to a redundant column. To function properly, this type of redundancy logic must know exactly when the program data begins shifting into the data register. However, in many cases, such program data timing knowledge is not available, so that conventional redundancy logic cannot be used.

For example, many modern ICs use the industry standard JTAG (Joint Test Action Group) interface for programming purposes. JTAG refers to IEEE standard 1149.1-1990 (includes IEEE Std 1149.1a-1993), published by the Institute of Electrical and Electronics Engineers, Inc. on Oct. 21, 1993 under ISBN 1-55937-350-4, herein incorporated by reference. IEEE standard 1149.1 defines a boundary scan test method for detecting bad connections (shorted pins, open pins, bad traces, etc.) in circuit boards. The JTAG interface includes a test data input (TDI) pin for loading serial test data into the data register of an IC, and this TDI pin is often used as a serial programming interface on many ICs. For example, input terminal 201 could represent a TDI pin in a JTAG-programmable IC (and register output pin could represent a TDO (test data output) pin to pass data out from data register 210).

Because conventional JTAG-based programming methods involve continuously shifting the programming data through multiple daisy-chained ICs (i.e., the TDO pin of an IC being connected to the TDI pin of a subsequent IC), none of the individual ICs has knowledge of when its own program data is being loaded into its shift register. Only when program data has filled the entire chain of ICs can an individual IC "know" its specific program data. Therefore, conventional redundancy logic cannot be used in JTAG-compliant ICs.

Accordingly, it is desirable to provide a system and method for incorporating redundancy into a serially programmable IC without requiring specific knowledge about the address or timing of program data.

SUMMARY OF THE INVENTION

The invention provides a system and method for incorporating redundancy into a serially-programmable IC by dividing an input data register into discrete data register portions associated with column groupings (both primary and redundant) within a memory array. When a defective column(s) is detected among the primary columns of the memory array, bypass logic removes the data register portion associated with the defective column grouping (i.e., the primary column grouping including the defective column) from the serial programming path. To make up for this reduction in data register space, the bypass logic then incorporates a data register portion associated with a redundant column grouping into the serial programming path. In this manner, a defective column grouping is simply "skipped" during programming operations, with the programming bitstream being shifted into the redundant column groupings. This beneficially allows the programming bitstream to be shifted into the IC without any data reordering or address tracking.

According to an embodiment of the invention, a serially programmable IC can comprise a series of daisy-chained data register circuits, each data register circuit including a cascaded shift register and localized bypass logic for that shift register. The localized bypass logic can comprise a multiplexer that multiplexes the output of the data register circuit between the shift register output and the input of the data register circuit. Therefore, the multiplexer can either send the input of the data register circuit directly to the output (i.e., bypass the shift register) or connect the shift register between the input and output of the data register circuit. The control logic for the multiplexer can simply be a fuse that is programmed at the factory based on testing of the memory array.

If a defective column is detected, the data register circuit associated with the column grouping including the defective column is programmed to bypass its shift register, and one of the data register circuits associated with the redundant columns is enabled (i.e., the shift register in the redundant data register circuit is placed in the serial programming data path by its multiplexer).

Reading data from the memory array programmed in this manner simply involves reading out any data stored in redundant columns, and then reading out data stored in the primary columns, bypassing any columns bypassed during the programming operation. According to an embodiment of the invention, the IC can include an output control circuit performing the read operation. The output control circuit includes a defective address circuit for identifying the enabled redundant column groupings and bypassed primary column groupings. The defective address circuit can include programmable memories into which local addresses for the defective column groupings and redundancy enable indicators for the enabled redundant column groupings can be programmed (at the same time that the control circuits for the multiplexers in the data register circuits are programmed).

To perform a read operation, a redundant bit shifting multiplexer first shifts out the data stored in the redundant column groupings identified by the redundancy enable indicators as containing stored data. Then, a primary bit shifting multiplexer shifts out the remainder of the data word from the primary columns, skipping those primary column groupings identified by the local addresses in defective address circuit as including defective columns. In this manner, the stored data can be serially read out from the redundancy-enabled memory array.

The present invention will be more fully understood in view of the following description and drawings.

DETAILED DESCRIPTION OF THE DRAWINGS

Figure 1:
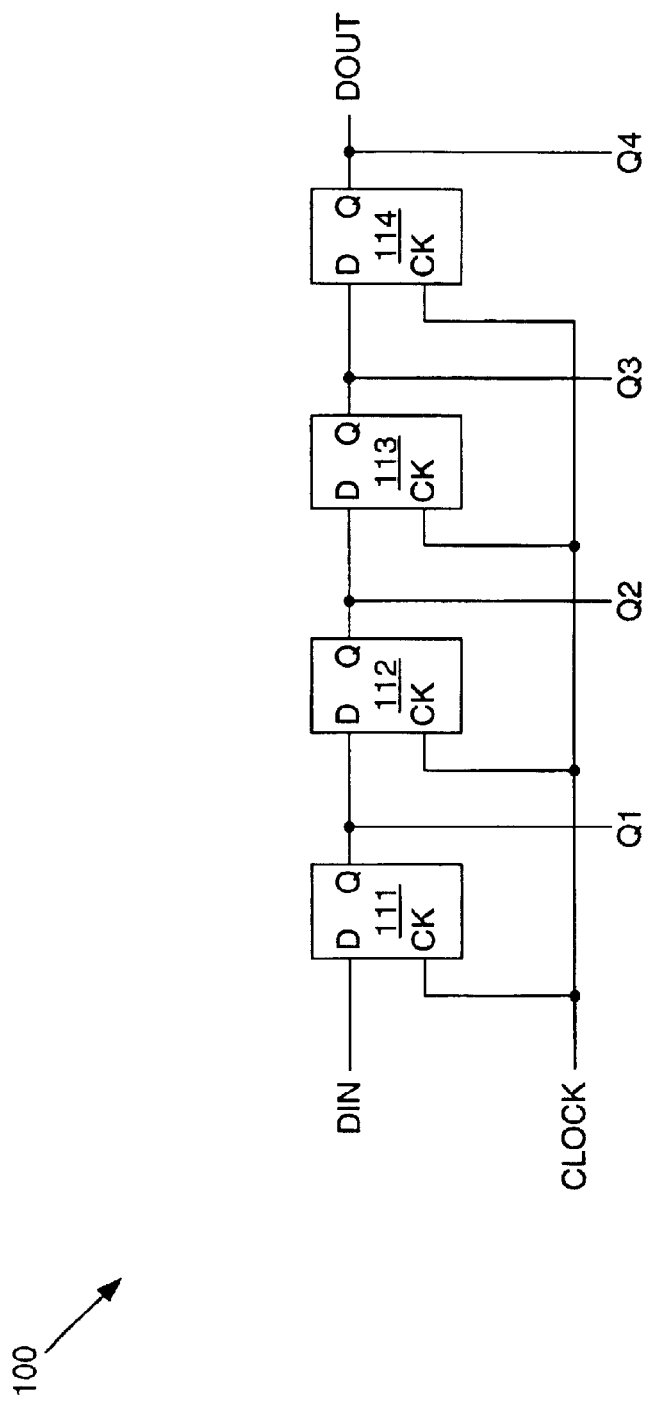
FIG. 1 is a schematic diagram of a conventional cascaded shift register.
Figure 2:
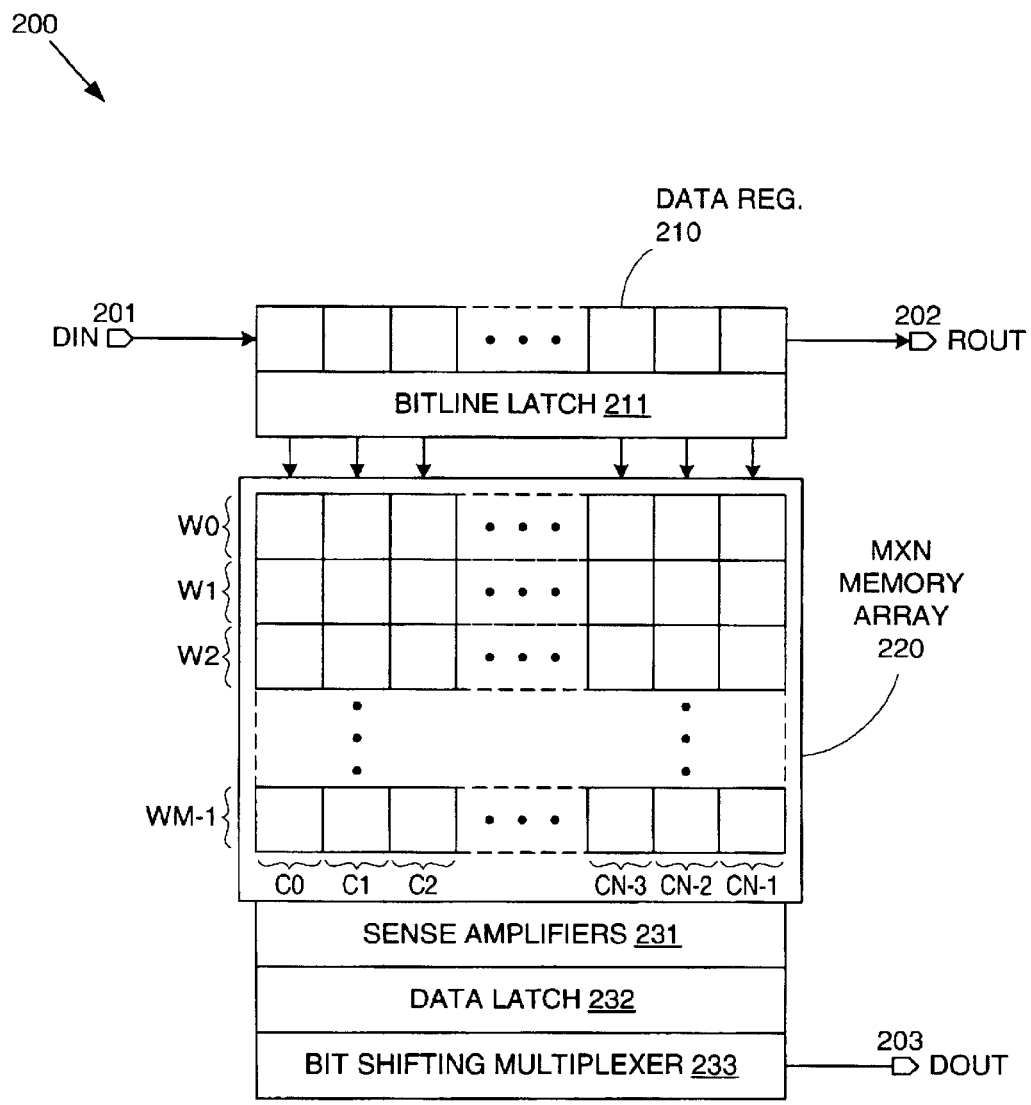
FIG. 2 is a schematic diagram of a conventional serially programmable IC.
Figure 3:
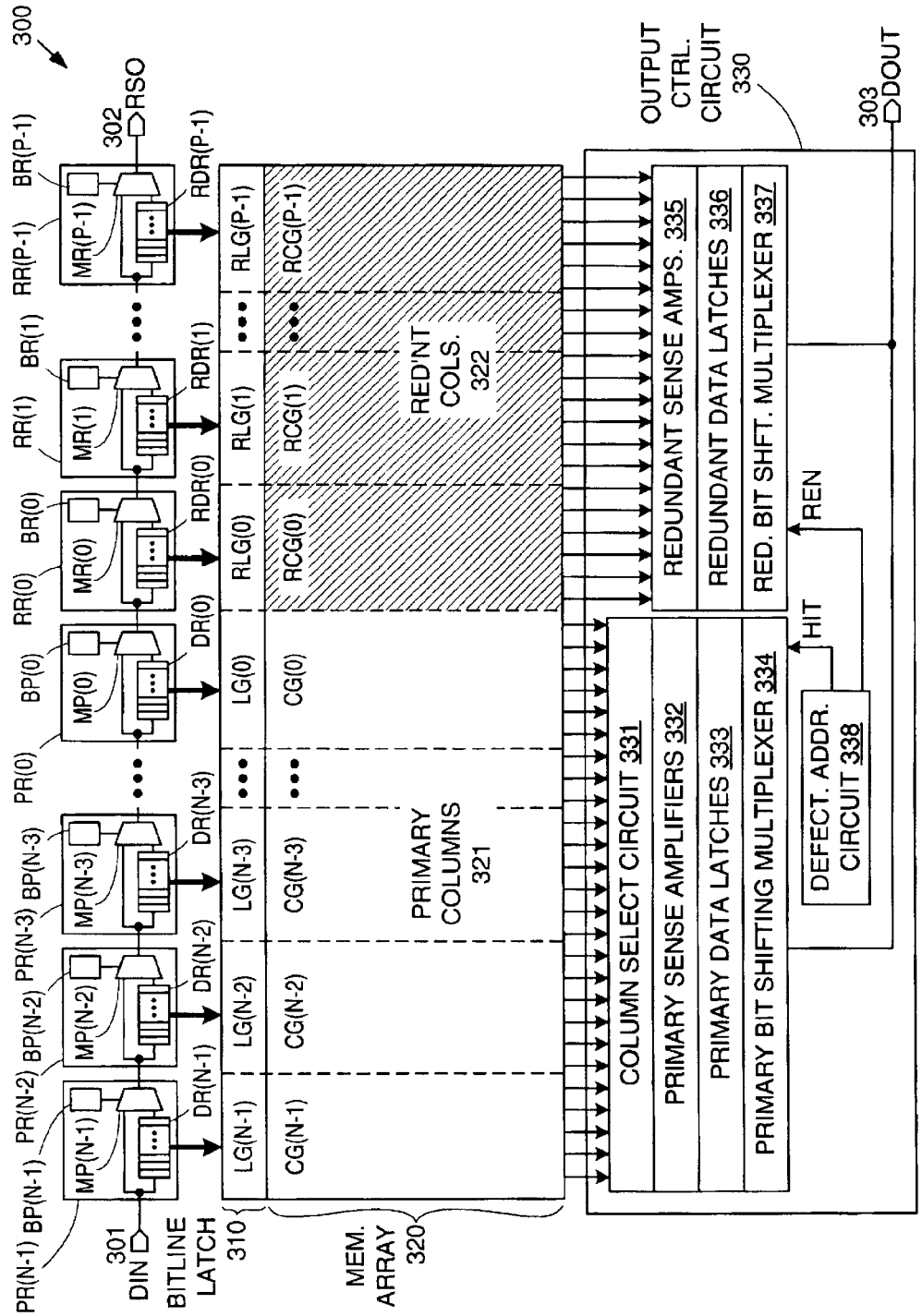
FIG. 3 is a schematic diagram of a serially programmable IC incorporating memory array redundancy, according to an embodiment of the invention.

FIG. 3 shows a serially programmable IC 300 that incorporates redundant memory columns, in accordance with an embodiment of the invention. IC 300 includes an input terminal 301, a register output terminal 302, N primary register circuits PR (labeled PR(N-1) through PR(0)), P redundant register circuits RR (labeled RR(P-1) through RR(0)), a bitline latch 310, a memory array 320, an output control circuit 330, and an output terminal 303. Primary register circuits PR and redundant register circuits RR are daisy-chained between input terminal 301 and register output terminal 302. IC 300 can comprise any type of serially programmable IC, including a JTAG-programmable IC, in which case input terminal 301 and register output terminal 302 may comprise TDI and TDO (test data output) terminals, respectively. Note that while the embodiment of FIG. 3 shows IC 300 organized with the "primary" components on the left and the "redundant" components on the right, the relative positions can be changed, for example by placing the redundant portion of IC 300 in front of the primary portion, in accordance with the invention.

Programming

Memory array 320 includes a plurality of primary columns 321 and a plurality of redundant columns 322. Primary columns 321 are organized into N primary column groupings CG (labeled CG(N-1) through CG(0)), and redundant columns 322 are organized into P redundant column groupings RCG (labeled RCG(P-1) through RCG(0)). Primary column groupings CG and redundant column groupings RCG all have the same width. Bitline latch 310, which has the same width as memory array 320, is divided into N primary latch groupings LG (labeled LG(N-1) through LG(0)) and P redundant latch groupings RLG (labeled RLG(P-1) through RLG(0)). Each primary latch grouping LG is associated with one of primary column groupings CG and one of primary register circuits PR, while each redundant latch grouping RLG is associated with one of redundant column groupings RCG and one of redundant register circuits RR.

Each of primary register circuits PR includes a set of data registers DR, a multiplexer MP, and a primary bypass circuit BP. One of the input terminals of multiplexer MP acts as a data input terminal for primary register circuit PR, while the output terminal of multiplexer MP acts as the data output terminal for primary register circuit PR. Meanwhile, data registers DR, which have the same width as its associated primary latch grouping LG (and primary column grouping CG), are connected between the data input terminal and the second input terminal of multiplexer MP. Finally, primary bypass circuit BP is connected to the control terminal of multiplexer MP, and acts as a multiplexer control circuit that determines whether data at the data input terminal of primary register circuit PR is provided to data registers DR or passed directly to the data output terminal.

Similarly, each of redundant register circuits RR includes a set of redundant data registers RDR, a multiplexer MR, and a redundant bypass circuit BR. One of the input terminals of multiplexer MR acts as a data input terminal for redundant register circuit RR, while the output terminal of multiplexer MR acts as the data output terminal for redundant register circuit RR. Meanwhile, redundant data registers RDR, which have the same width as its associated redundant latch grouping RLG (and redundant column grouping RCG), are connected between the data input terminal and the second input terminal of multiplexer MR. Finally, redundant bypass circuit BR is connected to the control terminal of multiplexer MR, and acts as a multiplexer control circuit that determines whether data at the data input terminal of redundant register circuit RR is provided to redundant data registers RDR or passed directly to the data output terminal.

During a programming operation, a serial programming bitstream DIN provided at input terminal 301 can be shifted into data registers DR of primary register circuits PR and redundant data registers RDR of redundant register circuits RR (as required). Once the entire programming bitstream has been completely shifted into data registers DR and RDR, the stored programming data is latched into bitline latch 310 and then programmed into a selected row of memory array 320 in a page mode operation. Note that the portions of programming bitstream DIN that are shifted into primary data registers DR are programmed into primary columns 321, while any portions of programming bitstream DIN that are shifted into redundant data registers RDR are programmed into redundant columns 322. Therefore, by properly configuring bypass circuits BP and BR (which, as described above, determine whether or not data is shifted into their associated data registers DR and RDR, respectively), redundancy can be incorporated into IC 300.

For example, if memory array 320 does not include any defective columns, each primary bypass circuit BP can be set to "enable" (i.e., not bypass) its associated primary data register DR and incorporate that primary data register DR in the serial programming path, while each redundant bypass circuit BR can be set to bypass its associated redundant data register RDR from the serial programming path. In such a configuration, redundant columns 322 will simply go unused, and the programming bitstream will be completely programmed into primary columns 321. Note that the detection of defective columns and the configuration of bypass circuits BP and BR would typically be performed at the factory (that produced IC 300), and bypass circuits BP and BR would typically comprise non-volatile programmable circuits that would retain their configurations once programmed. According to an embodiment of the invention, bypass circuits BP and BR may comprise fusible circuits that provide either a logic HIGH output or a logic LOW output, depending on the state of a fuse within the circuit.

On the other hand, if for example, primary column grouping CG(N-3) includes a defective column, primary bypass circuit BP(N-3) may be set to bypass primary data registers DR(N-3) from the serial programming path, and one of redundant bypass circuits BR (e.g., redundant bypass circuit BR(0)) may be set to enable its associated redundant data register RDR to incorporate the redundant data registers RDR in the serial programming path. The programming bitstream would then simply "skip" primary data registers DR(N-3), so that the programming data that would originally have been stored in data registers DR(N-3) would end up in data registers DR(N-4), the programming data originally intended for data registers DR(N-4) would end up in data registers DR(N-5), and so forth, with the data originally intended for data registers DR(0) ending up in redundant data registers RDR(0). Subsequent programming of the stored programming data into memory array 320 would therefore avoid the defective column(s) in primary column grouping CG(N-3) and instead make use of the known good columns in redundant column grouping RCG(0).

Thus, for each primary column grouping CG that includes a defective column, one of the sets of primary data registers DR is bypassed and one of the sets of redundant data registers RDR is enabled. According to an embodiment of the invention, the order of incorporation for redundant data registers RDR starts from the set of redundant data registers RDR furthest from the primary data registers DR (i.e., redundant data registers RDR(P-1)) and progresses towards the primary data registers DR. According to another embodiment of the invention, the order of incorporation for redundant data registers RDR starts from the set of redundant data registers RDR closest to the primary data registers DR (i.e., redundant data registers RDR(0)) and progresses away from primary data registers DR. Any other arbitrary order of incorporation may be used in accordance with the invention.

Figure 8:
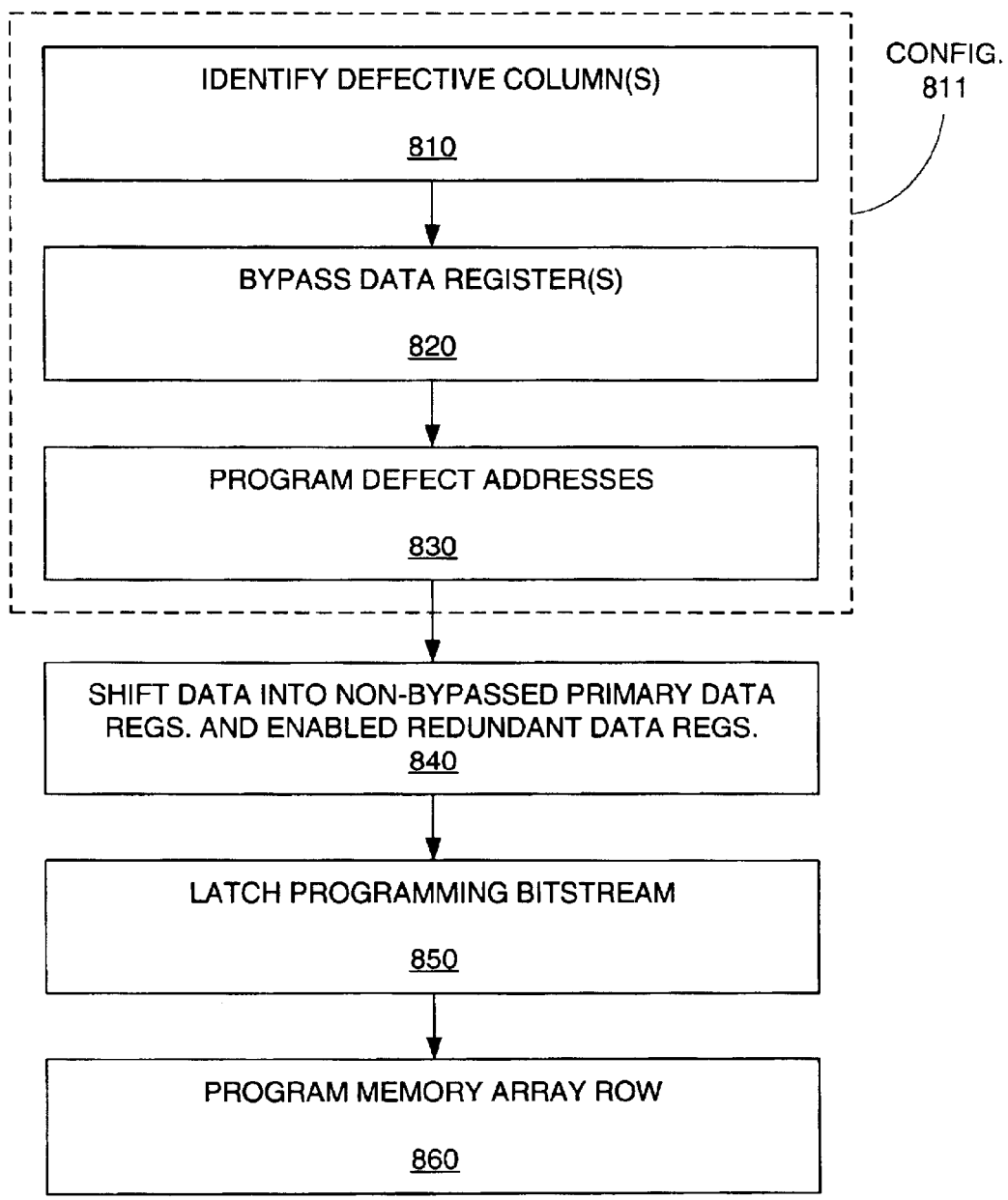
FIG. 8 is a flow diagram of a serial programming methodology, in accordance with an embodiment of the invention.

FIG. 8 provides a flow chart summarizing the programming operation. In an "IDENTIFY DEFECTIVE COLUMN (S)" step 810, the columns of memory array 320 are tested for defects. Then, in a "BYPASS DATA REGISTER(S)" step 820, those primary bypass circuits BP associated with the defective primary columns are configured to bypass their associated primary data registers DR and a corresponding number of redundancy bypass circuits BR are configured to include their associated redundant data registers RDR in the serial programming path. Then, in a "PROGRAM DEFECT ADDRESSES" step 830, local addresses for defective primary column groupings CG and for the redundant column groupings RCG associated with redundant data registers RDR included in the serial programming data path are then determined for use in read operations (described in detail below). Note that steps 810, 820, and 830 would typically be performed at the factory and can be grouped into a single "CONFIGURATION" step 811 that generates a configured IC ready for use in a serial programming application.

Once the IC has been configured as described with respect to steps 810, 820, and 830, a programming bitstream can be shifted in to data registers DR and RDR. As indicated in a "SHIFT DATA INTO NON-BYPASSED PRIMARY DATA REGISTERS AND ENABLED REDUNDANT REGISTERS" step 840, the programming bitstream is shifted into the primary data registers via input terminal 301, filling the primary data registers DR while bypassing those primary data registers DR associated with defective column groupings. The shifting of the programming bitstream continues into the redundant data registers RDR enabled in response to the bypassed primary data registers DR. Once the programming bitstream has been completely shifted through input terminal 301, the stored data is latched into bitline latch 310 in a "LATCH PROGRAMMING BITSTREAM" step 850, and the latched data is then programmed into memory array 320 in a "PROGRAM MEMORY ARRAY ROW" step 860.

Reading

Returning to FIG. 3, to read a word out of memory array 320, data stored in redundant columns 322 is latched into redundant data latches 336 via redundant sense amplifiers 335. A defect address circuit 338 provides a redundancy enable signal REN[P-1:0] that instructs redundant bit shifting multiplexer 337 as to which of redundant columns 322 store valid data. That data is then shifted out of output terminal 303 by a redundant bit shifting multiplexer 337.

The remainder of the word is then read out from primary columns 321 via primary data latches 333, primary sense amplifiers 332, and a primary bit shifting multiplexer 334. A column select circuit 331 between primary columns 321 and primary sense amplifiers 332 reduces the required number of primary sense amplifiers 332 and latches in primary data latches 333 by allowing the data in primary columns 321 to be read out in smaller portions, rather than all at once.

For word data to be properly read out from primary columns 321, any column grouping CG that includes a defective column(s) must be skipped during the read operation. Defective address data HIT provided by defective address circuit 338 instructs primary bit shifting multiplexer 334 as to which column groupings must be bypassed.

Figure 4:
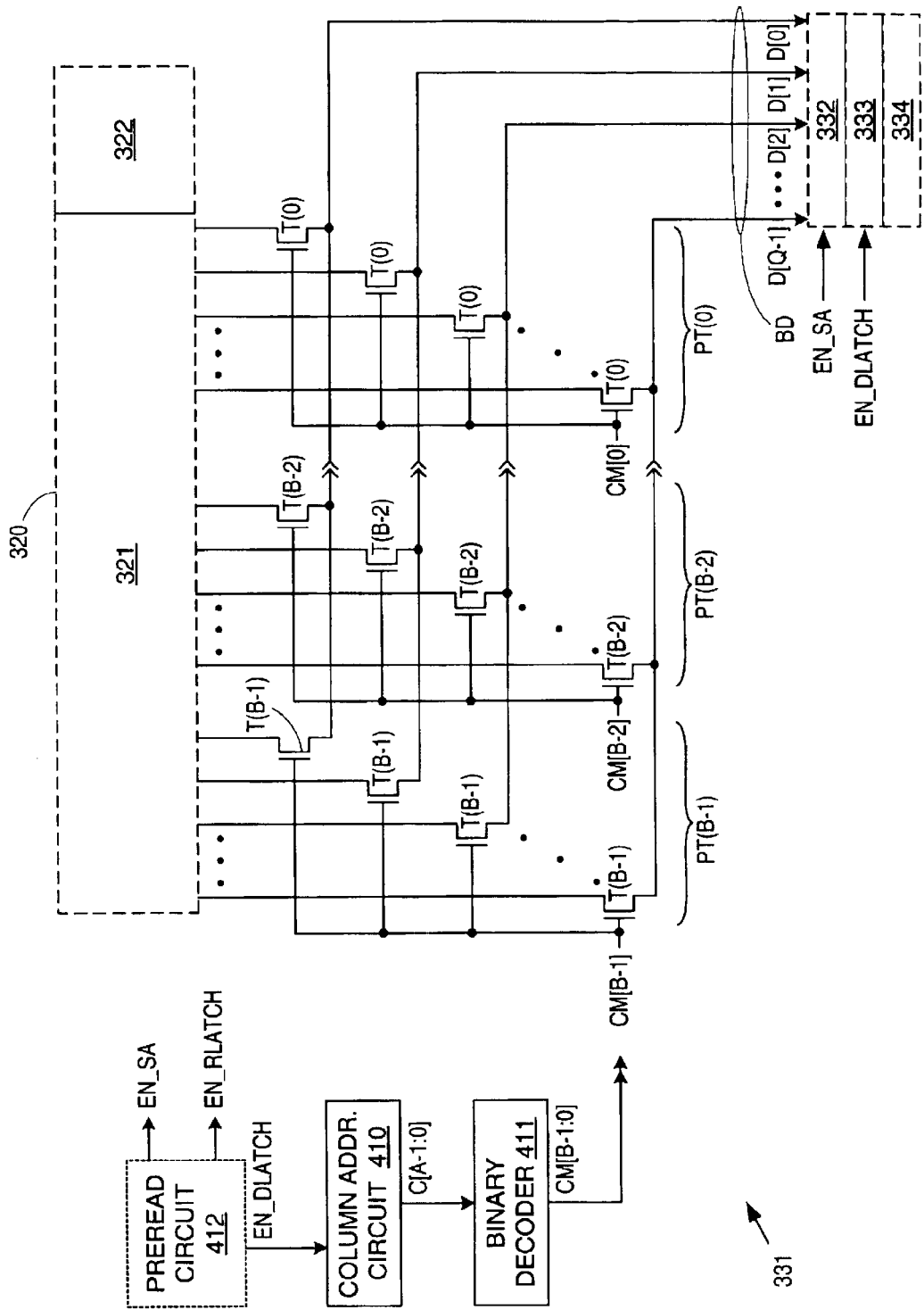
FIG. 4 is a schematic diagram of a column select circuit for the serially programmable IC of FIG. 3, according to an embodiment of the invention.

FIG. 4 shows a schematic diagram of column select circuit 331 shown in FIG. 3, according to an embodiment of the invention. Column select circuit 331 includes a column address circuit 410 for generating a binary sequence of A-bit column addresses C[A-1:0], a binary column decoder 411 for decoding column addresses C[A-1:0] into B-bit multiplexed column select signals CM[B-1:0], a quantity B of pass transistor groupings PT (labeled PT(B-1) through PT(0)), and an optional preread circuit 412 (described in more detail below with respect to both FIG. 4 and FIG. 5).

Each of pass transistor groupings PT includes a quantity Q of pass transistors T that are connected between a primary column 321 of memory array 320 and a signal line on a Q-bit output data bus BD. The control terminals of the pass transistors T in a particular pass transistor grouping PT are all coupled to receive a selected bit of column select signals CM[B-1:0]. Therefore, for each value of column select signal C[B-1:0], only one of pass transistor groupings PT (the "active" pass transistor grouping) will have its pass transistors T turned on. Consequently, as column addresses C[A-1:0] are incremented, successive pass transistor groupings PT are set active, thereby allowing the data stored in primary columns 321 to be read out in sequential Q-bit segments. This "segmented" reading of the primary column data reduces the total number of sense amplifiers 332 required by IC 300.

Figure 5:
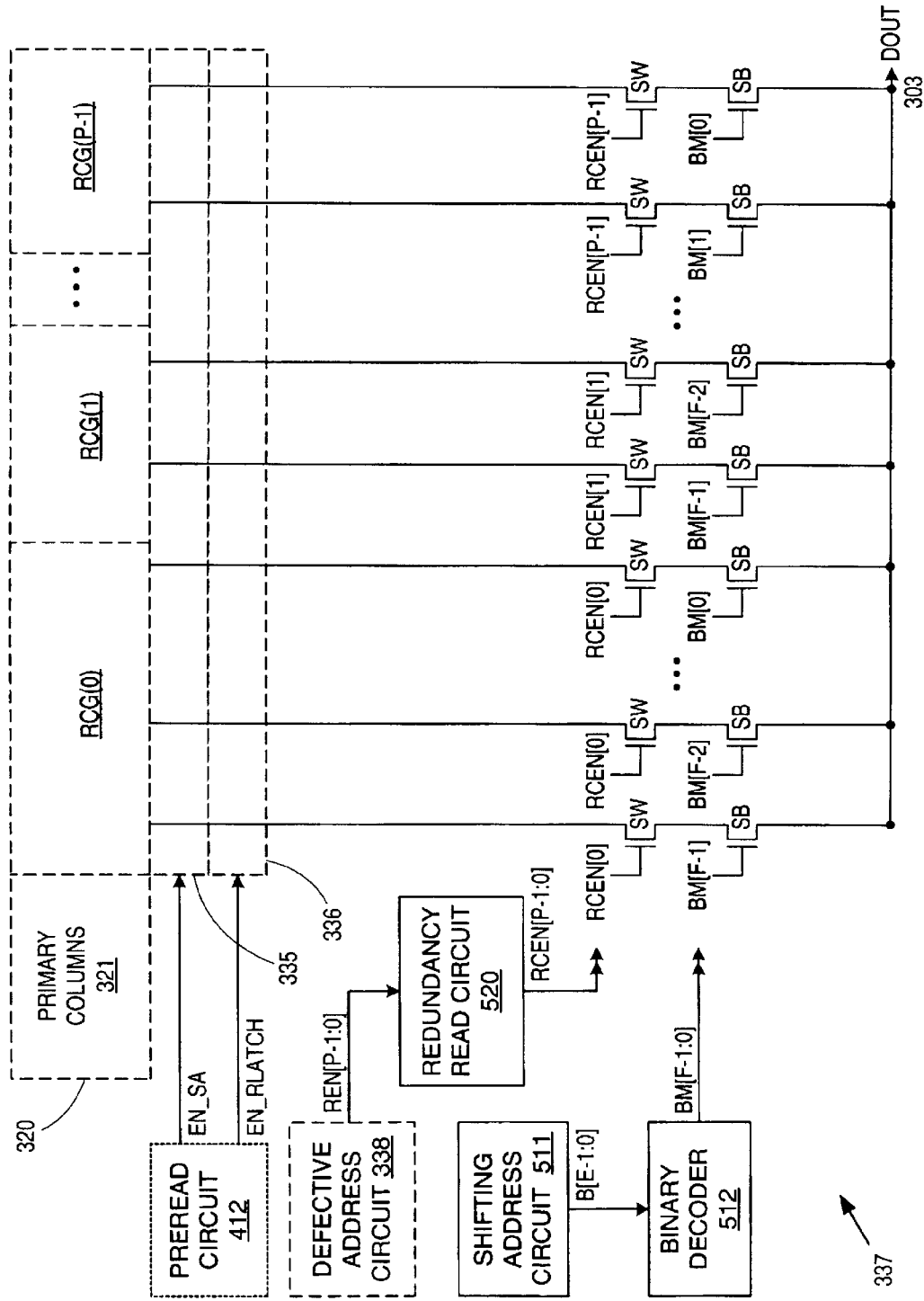
FIG. 5 is a schematic diagram of a bit shifting multiplexer for primary columns of the serially programmable IC of FIG. 3, according to an embodiment of the invention.

FIG. 5 shows a schematic diagram of redundant bit shifting multiplexer 337 according to an embodiment of the invention. Redundant bit shifting multiplexer 337 includes a shifting address circuit 511, a binary decoder 512, a redundancy read circuit 520 for generating a sequence of P-bit word addresses, a plurality of word switches SW, and a plurality of shifting switches SB. A word switch SW and a shifting switch SB, which can simply comprise pass transistors, are connected between each latch in redundant data latches 336 and output terminal 303 of IC 300.

Redundancy read circuit 520 is coupled to receive redundancy enable signal REN[P-1:0] from defective address circuit 338. Redundancy enable signal REN[P-1:0] identifies those redundant column groupings RCG that have been enabled (described in more detail below with respect to FIG. 6), and is used by redundancy read circuit 520 to generate a redundant column select signal RCEN[P-1:0]. Redundant column select signal RCEN[P-1:0] is a binary selection signal in which all the bits of the signal are equal to zero except for a single bit that is equal to one (the "selection bit"). Note that according to other embodiments of the invention, the binary selection signal can consist of all ones except for a single bit equal to zero.

The individual bits of redundant column select signal RCEN[P-1:0] are applied to the control terminals of word switches SW, with each bit being applied to all the word switches SW associated with a single redundant column grouping RCG. For example, as shown in FIG. 5, the LSB of redundant column select signal RCEN[P-1:0] (i-e., RCEN [0]) is provided to all the word switches SW associated with redundant column grouping RCG(0), the next bit RCEN[1] is provided to all the word switches SW associated with redundant column grouping RCG(1), and so forth. Note that according to other embodiments of the invention, the individual bits of redundant column select signal RCEN[P-1:0] can be provided to the groupings of word switches SW in different orders. Because redundant column select signal RCEN[P-1:0] is a binary selection signal, only those word switches SW that receive the selection bit are turned on. Therefore, as redundant column select signal RCEN[P-1:0] is incremented, the word switches SW associated with successive redundant column groupings RCG are turned on.

Concurrently, shifting address circuit 511 generates a sequence of E-bit shifting addresses B[E-1:0], which binary decoder 512 decodes into a series of F-bit bit shifting signals BM[F-1:0]. Each of bit shifting signals BM[F-1:0] is a binary selection signal, the individual bits of which are applied to the control terminals of shifting switches SB. Unlike the individual bits of redundant column select signal RCEN[P-1:0], which are applied to consecutive groupings of word switches SW, the individual bits of bit shifting signals BM[F-1:0] are applied consecutive shifting switches SB. In other words, for a given bit BM[n] from bit shifting signal BM[F-1:0], every nth shifting switch SB is turned on.

Thus, for any given combination of redundant column signal RCEN[P-1:0] and bit shifting signal BM[F-1:0], only one redundant data latch 336 is connected to output terminal 302. To shift a serial string of data bits out from terminal 302, shifting address circuit 511 increments bit shifting address B[E-1:0] continuously (e.g., once per clock cycle), while redundancy read circuit 520 increments redundant column signal RCEN[P-1:0] each time bit shifting address B[E-1:0] completes a full cycle (i.e., transitions from its maximum value back to its minimum value). In this manner, redundant bit shifting multiplexer 337 provides a serial output of the data latched into redundant data latches 336. Once this redundant data has been read out from redundant data latches 336, the remaining word data can be read out from primary data latches 333 (described in more detail below with respect to FIG. 6).

As noted above, column select circuit 331 shown in FIG. 4 can also include a preread circuit 412 that manages the flow of read operations to allow concurrent sensing of stored data, thereby improving overall read efficiency. According to an embodiment of the invention, preread circuit 412 generates a sense amplifier enable signal EN_SA, a data latch enable signal EN_DLATCH, and a redundant data latch enable signal EN_RLATCH. A read operation using preread circuit 412 is described below with respect to both FIGS. 4 and 5.

According to an embodiment of the invention, when a read instruction is asserted, preread circuit 412 provides sense amplifier enable signal EN_SA to primary sense amplifiers 332 and redundant sense amplifiers 335 to turn on those sense amplifiers and initiate an initial sensing operation. Once this initial sensing operation is complete, preread circuit 412 pulses data latch enable signal EN_DLATCH and redundant data latch enable signal EN_RLATCH to instruct primary data latches 333 and redundant data latches 336, respectively, to latch the sensed data from primary sense amplifiers 332 and redundant sense amplifiers 335, respectively.

As indicated in FIG. 4, data latch enable signal EN_DLATCH is also be provided to column address circuit 410 to instruct column address circuit 410 to increment column address C[A-1:0]. Therefore, as soon as a set of data is latched into primary data latches 333, a sensing operation on the next set of data to be latched into primary data latches can be initiated. This allows the relatively lengthy sensing operations to be performed in parallel with shifting operations (i.e., operations in which latched data is shifted out from the data latches), so that once the shifting operation is complete, a new set of data can be immediately latched into data latches 333. As a result, the time required to read a word out of memory array 320 is minimized since dedicated "sensing time" is not required between successive shifting operations. The only delay occurs during the initial sensing operation, after which a steady data stream can be read out.

For example, a read operation may begin with column address circuit 410 initialized such that column address C[A-1:0] is equal to zero. Binary decoder 411 would then decode this column address into a column select signal CM[B-1:0] to turn on only pass transistors T(0) (i.e., CM[00 . . . 001]). Consequently, during the initial sensing operation at the start of the read operation, sense amplifiers 332 would sense the data accessed by pass transistor grouping PT(0). Upon completion of this sensing operation, data latch enable signal EN_DLATCH would cause the data from sense amplifiers 332 to be latched into data latches 333. Data latch enable signal EN_DLATCH would also cause column address circuit 410 to increment column address C[A-1:0] to be equal to one. Binary decoder 411 would then decode this new column address into a column select signal CM[B-1:0] to turn on only pass transistors T(1) (i.e., CM[00 . . . 010]). Sense amplifiers 332 would then sense the data accessed by pass transistor grouping PT(1) as the latched data is shifted out of data latches 333.

Upon completion of the shifting operation, preread circuit 412 would pulse data latch enable signal EN_DLATCH to immediately latch the new sensed data in sense amplifiers 332 into data latches 333 and also instruct column address circuit 410 to increment column address C[A-1:0]. In this manner, all sensing operations after the initial sensing operations are be performed during data shifting operations, so that no delays are experienced when latching a new set of data into data latches 333.

Figure 6:
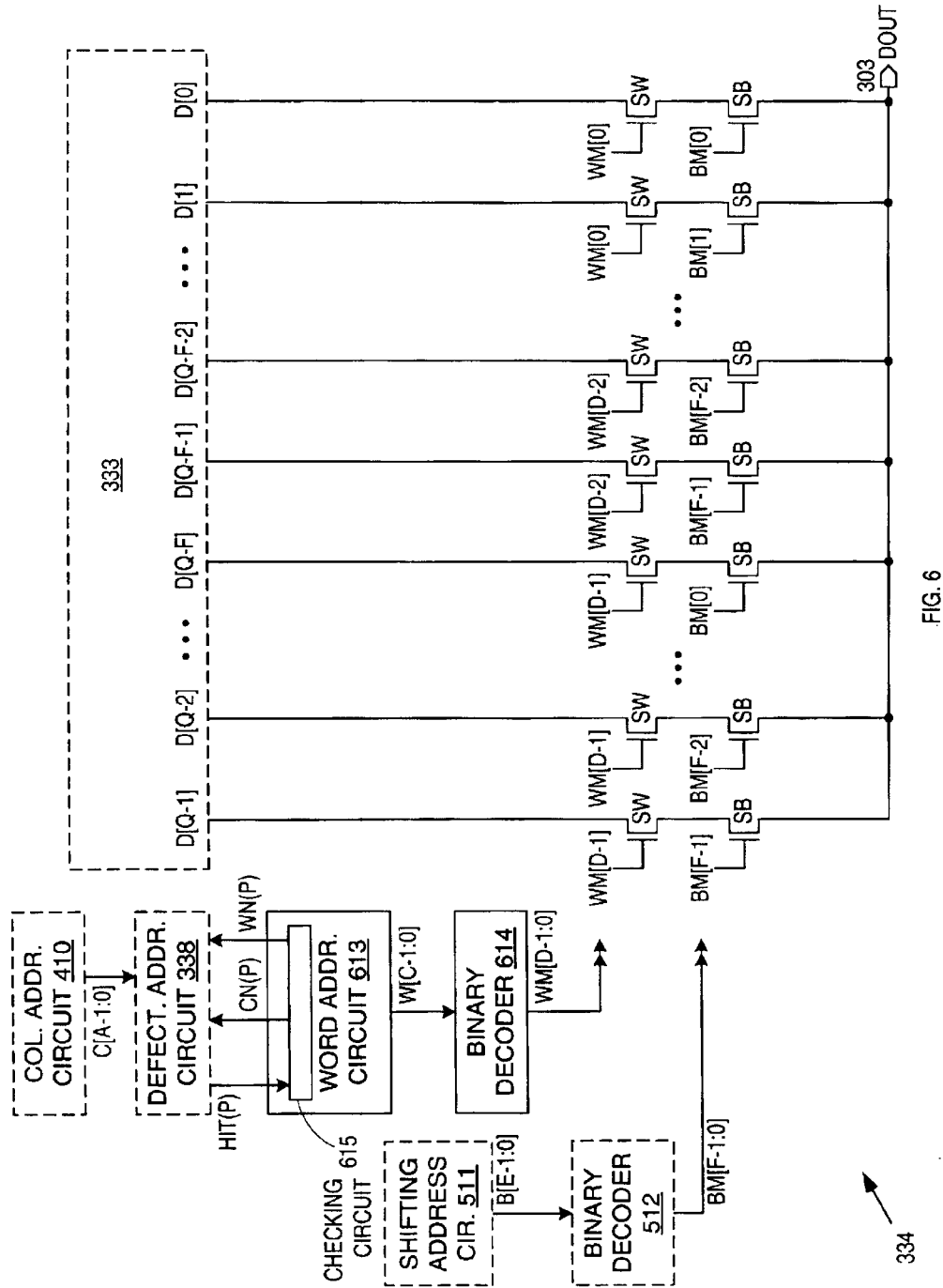
FIG. 6 is a schematic diagram of a defective address detection circuit for the serially programmable IC of FIG. 3, according to an embodiment of the invention.

The actual shifting out of data from data latches 333 is controlled by primary bit shifting multiplexer 334. To ensure that data is correctly read out of memory array 320, primary bit shifting multiplexer 334 must not read out any data from primary column groupings that have been bypassed during programming for having one or more defective columns. FIG. 6 shows a schematic diagram of primary bit shifting multiplexer 334 that includes such bypass logic, according to an embodiment of the invention. Like redundant bit shifting multiplexer 337 described with respect to FIG. 5, primary bit shifting multiplexer 334 couples a word switch SW and a shifting switch SB, which can simply comprise pass transistors, between each latch in primary data latches 333 and output terminal 303 of IC 300.

Bit shifting signals BM[F-1:0] from binary decoder 512 (described with respect to FIG. 5) are applied to the control terminals of shifting switches SB. Meanwhile, a word address circuit 613 generates a C-bit word address W[C-1:0] that a binary decoder 614 decodes into a D-bit word selection signal (binary selection signal) WM[D-1:0] that is provided to the control terminals of each word switch. The individual word selection signal bits WM[D-1], WM[D-2], . . . , WM[0] are applied to consecutive groupings of word switches SW, while bit shifting signals BM[F-1:0] are applied to consecutive shifting switches SB. As described with respect to FIG. 5, to shift a serial string of data bits out from output terminal 302, shifting address circuit 511 increments bit shifting address B[E-1:0] continuously (e.g., once per clock cycle), while word address circuit 613 increments word address W[C-1:0] each time bit shifting address B[E-1:0] completes a full cycle, until all the data bits latched into data latches 333 have been shifted out of output terminal 302.

To ensure that data is not shifted out from defective column addresses, word address circuit 613 includes a checking circuit 615 that performs a checking operation to determine whether or not a particular set of data is from a defective column grouping. Checking circuit 615 provides a set of test word addresses WN(P) and a set of test column addresses CN(P) to defective address circuit 338. Defective address circuit 338 compares those input test word and test column addresses with a set of defective column addresses that have been previously programmed into defective address circuit 338. If any matches are detected, defective address circuit 338 generates a defect indicator signal HIT for the associated test word address. The set of defect indicator signals HIT(P) provided back to checking circuit 615 then allows word address circuit 613 to skip the indicated word addresses when incrementing word address W[C-1:0].

Test word addresses WN(P) represent a predetermined number of word addresses that sequentially follow the current word address W[C-1:0]. For example, if the current word address W[C-1:0] is equal to zero (i.e., W[00 . . . 000]), then test word addresses WN(P) would include at least the next (sequential) word address (i.e., W[00 . . . 001]). Note that when a row change occurs, the word address that sequentially follows the maximum word address (i.e., W[11 . . . 111]) at the end of a row is the minimum word address (i.e., W[00 . . . 000]). Thus, for example, if the current word address W[C-1:0] is equal to W[11 . . . 110], the set of test word addresses WN(P) may include word addresses W[11 . . . 111], W[00 . . . 000], W[00 . . . 001], and so forth.

Meanwhile, the set of test column addresses CN(P) represent column address(es) that have been provided by column address circuit 410 (as described above with respect to FIG. 4), with each of the test column addresses being associated with one of the set of test word addresses WN(P) such that each pairing of a test column address and a test word address corresponds to a particular primary column grouping CG in memory array 320 (described in FIG. 3).

If the set of test word addresses is associated with a single pass transistor grouping PT (described with respect to FIG. 4), then all the test column addresses will be the same. A set of test word addresses is associated with a single pass transistor grouping PT when those test word addresses correspond only to data latched into primary data latches 333 via a single pass transistor grouping PT. Such a set of test word addresses can be designated a "single grouping set". For example, a "single grouping" set of test word addresses might include W[00 . . . 001], W[00 . . . 010], and W[00 . . . 011]. Each of those test word addresses would be associated with the same test column address.

Note, however, that the particular value of that test column address would depend on whether or not preread circuit 412 is operational (as described above with respect to FIGS. 4 and 5). If no preread is being performed, then the test column address would be equal to the current column address C[A-1:0] as provided by column address circuit 410 in FIG. 4. However, if a preread is being performed, the test column address would be equal to the column address immediately preceding the current column address (e.g., if the current column address is C[00 . . . 010] and a preread is being performed, the test column address associated with a "single grouping" set of test word addresses would be C[00 . . . 001]).

If a set of test word addresses are associated with multiple pass transistor groupings (i.e., the test word, addresses correspond to data latched into primary data latches via multiple pass transistor groupings PT), then that set of test word addresses can be designated a "multiple grouping set". Different test column addresses will then be associated with the test word addresses corresponding to different pass transistor groupings.

However, just as with "single grouping" sets, the specific test column addresses in the set of test column addresses will depend on whether or not a preread operation is being performed. If no preread is being performed, then the set of test column addresses will include the current column address and the column address immediately following the current column address.

For example, with no preread, if the current column address is C[00 . . . 010] and the set of test word addresses includes the word addresses W[11 . . . 111], W[00 . . . 000], and W[00 . . . 001], then the set of test column addresses would include C[00 . . . 010] (the current column address, associated with word address W[11 . . . 111]) and the column address C[00 . . . 011] (the column address immediately following the current column address, associated with word addresses W[00 . . . 000] and W[00 . . . 001]).

In contrast, if a preread is being performed, then the set of test column addresses will include the current column address and the column address immediately preceding the current column address. For example, if preread is active, the current column address is C[00 . . . 010] and the set of test word addresses includes the word addresses W[11 . . . 111], W[00 . . . 000], and W[00 . . . 001], the set of test column addresses would include C[00 . . . 001] (the column address immediately preceding the current column address, associated with word address W[11 . . . 111]) and C[00 . . . 010] (the current column address, associated with word addresses W[00 . . . 000] and W[00 . . . 001]).

According to an embodiment of the invention, checking circuit 615 can operate as a lookahead circuit to ensure that a continuous stream of read data is maintained even if a particular word address (or word addresses) must be bypassed. The checking operation would be performed as shifting address circuit 511 increments through its cycle of bit shifting addresses B[E-1:0], so that once the cycle is complete, word address circuit 613 would immediately be able to increment to the next non-defective word address W[C-1:0]. Therefore, lookahead functionality is provided because any defective addresses are bypassed before word address circuit 613 attempts to access those addresses.

Note that to properly provide this lookahead functionality, test word addresses WN(P) should include the maximum number of consecutive addresses that could be defective. Thus, for a memory array 320 including four redundant column groupings, the four word addresses immediately subsequent to the current word address W[C-1:0] would be included in the set of test word addresses WN(P) (i.e., P=4). For example, if the current word address W[C-1:0] is equal to zero, then the set of test word addresses WN(P) would include upcoming word addresses W[0 . . . 001], W[0 . . . 010], W[0 . . . 011], and W[0 . . . 100]. Then, even if all four word addresses needed to be bypassed (i.e., defective address circuit 338 generated a defect indicator signal HIT for all four addresses), the next word address would have to be a known "good" address.

Figure 7:
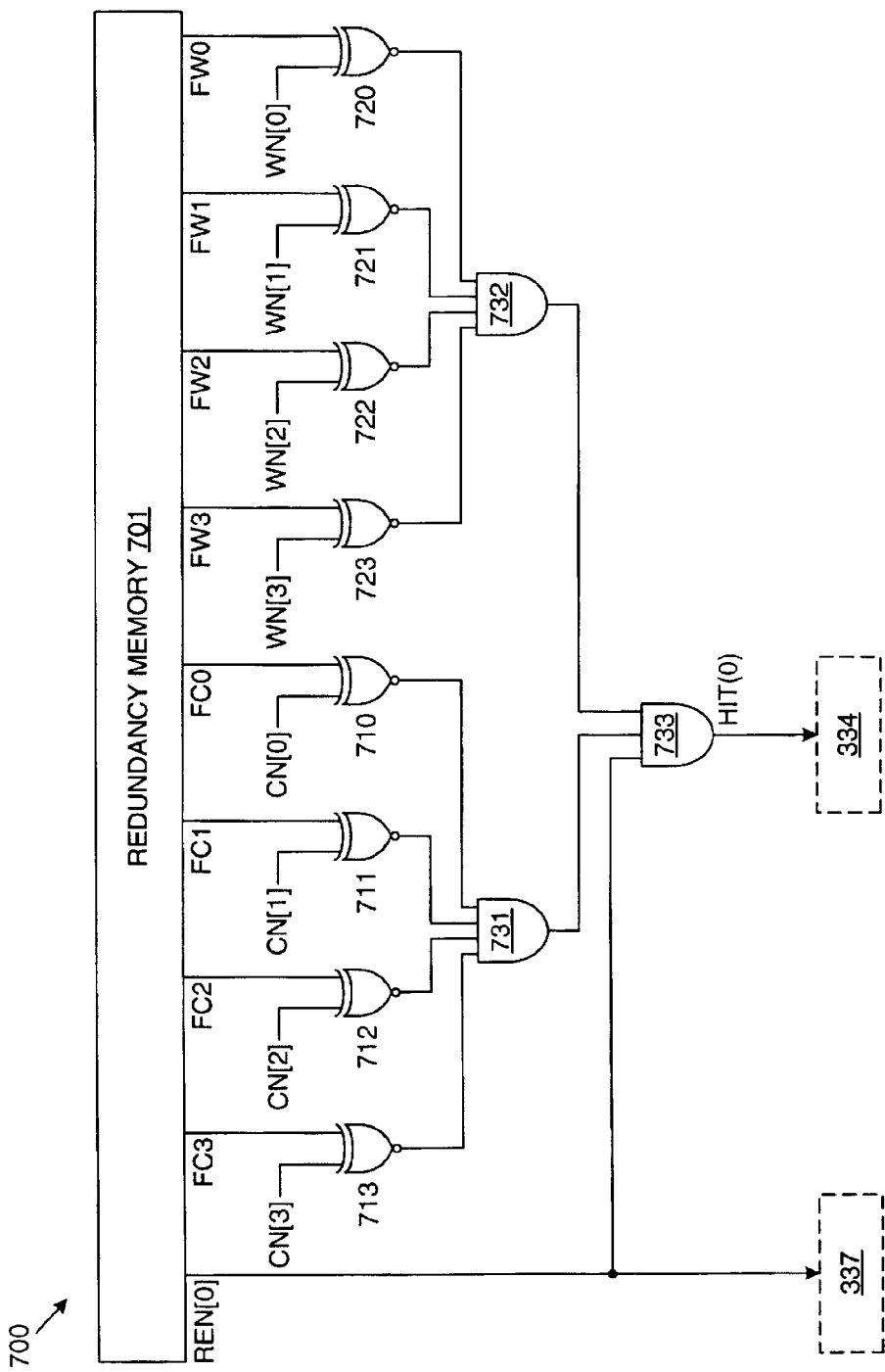
FIG. 7 is a schematic diagram of a bit shifting multiplexer for redundant columns of the serially programmable IC of FIG. 3, according to an embodiment of the invention.

FIG. 7 shows a defective address detection circuit 700 that may be included in defective address circuit 338 to perform the actual defective address detection, according to an embodiment of the invention. Defective address detection circuit 700 includes a redundancy memory 701, XNOR gates 710–713 and 720–723, and AND gates 731–733. For explanatory purposes, defective address detection circuit 700 is configured for 4-bit word and column addresses, redundancy memory 701 stores a 9-bit memory word that includes a redundancy enable bit REN[0], defective column address bits FC3, FC2, FC1, and FC0, and defective word address bits FW3, FW2, FW1, and FW0. Redundancy enable bit REN[0] indicates the presence of a defective column grouping (i.e., a column grouping of memory array 320 that includes one or more defective columns) at the location specified by the stored column address bits FC3-FC0 and word address bits FW3-FW0. Note that while a single redundancy memory 701 is shown for explanatory purposes, defective address circuit 338 would include a separate redundancy memory for each redundant column grouping.

To determine whether or not the current column grouping is a defective column grouping, XNOR gates 723, 722, 721, and 720 compare stored address bits FW3, FW2, FW1, and FW0, respectively, against bits WN[3], WN[2], WN[1], and WN[0], respectively, of one of the test word addresses WN(P) (described above with respect to FIG. 6). At the same time, XNOR gates 713, 712, 711, and 710 compare stored address bits FC3, FC2, FC1, and FC0, respectively, against bits CN[3], CN[2], CN[1], and CN[0], respectively, of an associated one of the test column addresses CN(P) (described above with respect to FIG. 6). The outputs of XNOR gates 710–713 are provided as inputs to AND gate 731, the outputs of XNOR gates 720–723 are provided as inputs to AND gate 732, and the outputs of AND gate 731 and AND gate 732 are provided as inputs to AND gate 733, along with redundancy enable bit REN[0]. Thus, only when test column address bits CN[3], CN[2], CN[1], and CN[0] match stored bits FC3, FC2, FC1, and FC0, respectively, and test word address bits WN[3], WN[2], WN[1], and WN[0] match stored bits FW3, FW2, FW1, and FW0, respectively, are the outputs of AND gates 731 and 732 are asserted, at which point AND gate asserts match signal HIT(0) (note that redundancy enable bit REN is already asserted).

Note that a separate defective address circuit would be required for each available redundant column grouping RCG. Note further that each of these "sets" of defective address circuits would have to be duplicated for each test column address and test word address pairing provided by the test column address set CN(P) and test word address set WN(P) provided by checking circuit 615 (shown in FIG. 6). For example, if IC 300 includes four redundant column groupings, and if checking circuit 615 operates in a lookahead mode and therefore includes four (not necessarily different) test column addresses in test column address set CN(P) and four test word addresses in test word address set WN(P), then defective address circuit 338 would require sixteen (=4×4) defective address detection circuits similar to defective address detection circuit 700, so that all four test column address-test word address pairings can be compared to each of the defective addresses.

Figure 9:
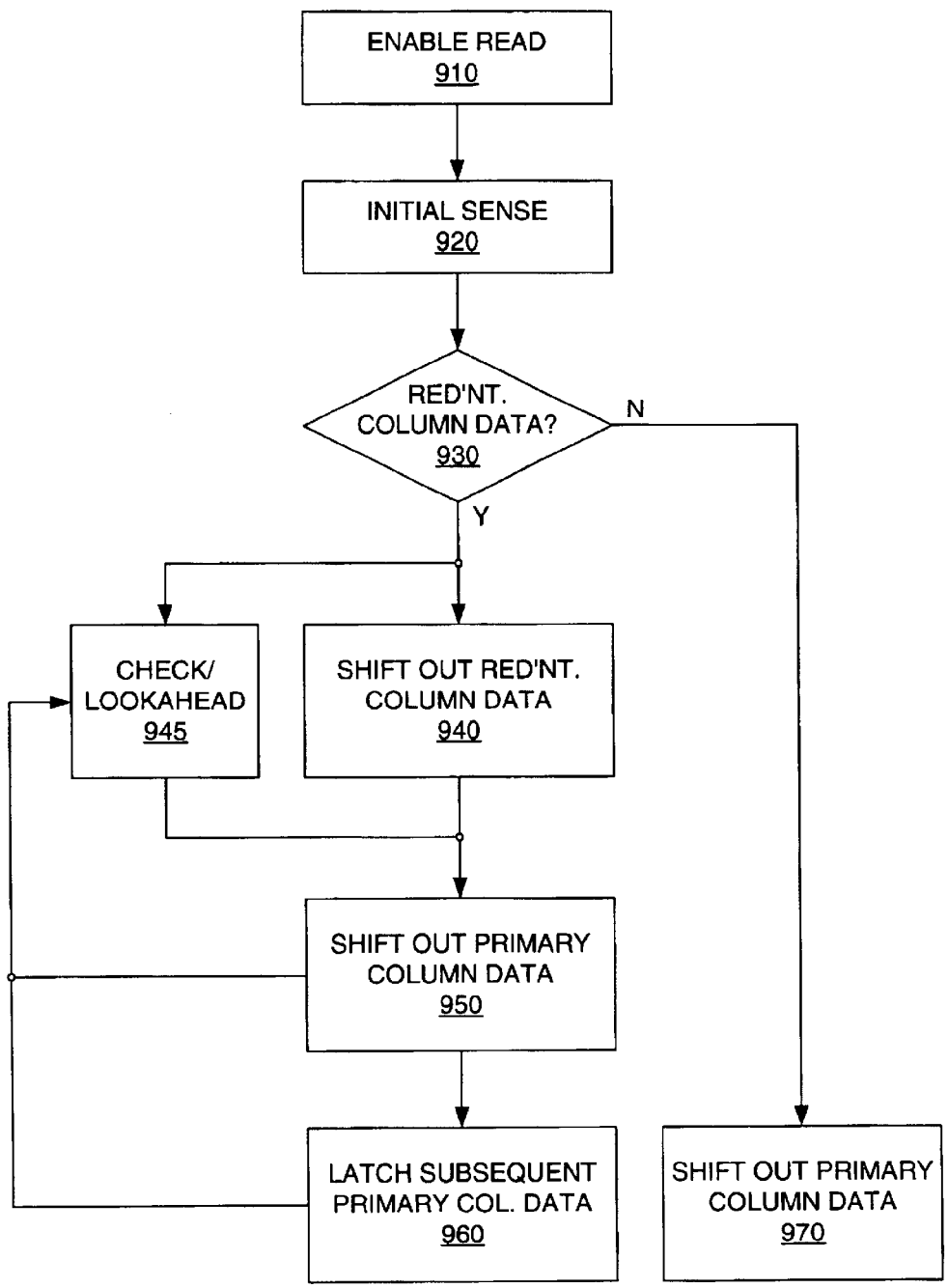
FIG. 9 is a flow diagram of a serial read methodology, in accordance with an embodiment of the invention.

FIG. 9 provides a flow chart summarizing the read operation described above. The read operation begins with the assertion of a read instruction in an "ENABLE READ" step 910. Any redundant column data and a first portion of the primary column data is latched into redundant data latches 336 and primary data latches 333, respectively, in an "INITIAL SENSE" step 920, as described with respect to FIGS. 4 and 5. In a "REDUNDANT COLUMN DATA?" step 930, if no redundant column data is present, the primary column data is shifted out directly in a "SHIFT OUT PRIMARY COLUMN DATA" step 970. Otherwise, the redundant column data is shifted out in a "SHIFT OUT REDUNDANT COLUMN DATA" step 940, as described with respect to FIG. 5.

Meanwhile, in a "CHECK/LOOKAHEAD" step 945, the upcoming primary column data is checked so that data associated with defective column addresses can be bypassed, as described with respect to FIG. 5. Then, in a "SHIFT OUT PRIMARY COLUMN DATA" step 950, the data associated with the first available non-defective primary column grouping is shifted out of primary data latches 333 by primary bit shifting multiplexer 334, as described with respect to FIG. 6.

Meanwhile, the next non-defective primary column grouping is determined in step 945, and the associated data is shifted out in step 950. When the data latched into primary data latches 333 has been fully shifted out, the next set of primary column data is latched into primary data latches 333 in a "LATCH SUBSEQUENT PRIMARY COLUMN DATA" step 960. The read operation continues in this manner until the entire data word has been read out of memory array 320. Note that the lookahead functionality of "CHECK/LOOKAHEAD" step 945 is enabled by performing step 945 in parallel with steps 940, 950, and 960, as appropriate.

The various embodiments of the structures and methods of this invention that are described above are illustrative only of the principles of this invention and are not intended to limit the scope of the invention to the particular embodiments described. Thus, the invention is limited only by the following claims and their embodiments.

What is claimed is:

1. A serially programmable integrated circuit (IC) comprising:
   a memory array comprising a plurality of primary columns and a plurality of redundant columns, the plurality of primary columns being organized into a plurality of primary column groupings, each having a first width, and the plurality,of redundant columns being organized into a plurality of redundant column groupings, each having the first width;
   a plurality of redundant register circuits, each comprising a redundant cascaded shift register having the first width;
   a plurality of primary register circuits, each comprising a primary cascaded shift register having the first width;
   a bitline latch comprising a plurality of primary bitline latch groupings and a plurality of redundant bitline latch groupings, each of the primary bitline latch groupings being coupled between a corresponding primary cascaded shift register and a corresponding one of the primary column groupings, and each of the redundant bitline latch groupings being coupled between a corresponding redundant cascaded shift registers and a corresponding one of the redundant column groupings; and
   bypass logic for selectively daisy-chaining the redundant cascaded shift registers and the primary cascaded shift registers.

2. The serially programmable IC of claim 1, wherein each of the plurality of primary register circuits further comprises a primary input terminal and a primary output terminal, and wherein the bypass logic comprises a primary multiplexer in each primary register circuit, the primary multiplexer in each primary register circuit comprising:
   a primary multiplexer output terminal coupled to the primary output terminal;
   a first primary multiplexer input terminal coupled to the primary input terminal;
   a second primary multiplexer input terminal, the primary cascaded shift register being coupled between the primary input terminal and the second primary multiplexer input terminal; and
   a primary multiplexer control terminal for selectively connecting one of the first primary multiplexer input terminal and the second primary multiplexer input terminal to the primary multiplexer output terminal.

3. The serially programmable IC of claim 2, wherein each of the plurality of redundant register circuits further comprises a redundant input terminal and a redundant output terminal, and wherein the bypass logic comprises a redundant multiplexer in each redundant register circuit, the redundant multiplexer in each redundant register circuit comprising:
   a redundant multiplexer output terminal coupled to the redundant output terminal;

a first redundant multiplexer input terminal coupled to the redundant input terminal;

a second redundant multiplexer input terminal, the redundant cascaded shift register being coupled between the redundant input terminal and the second redundant multiplexer input terminal; and a redundant multiplexer control terminal for selectively connecting one of the first redundant multiplexer input terminal and the second redundant multiplexer input terminal to the redundant multiplexer output terminal.

4. The serially programmable IC of claim 3, wherein the plurality of primary register circuits are daisy-chained together, and wherein the redundant register circuits are daisy-chained together, the primary output terminal of one of the plurality of primary register circuits being coupled to the redundant input terminal of one of the plurality of redundant register circuits.

5. The serially programmable IC of claim 4, wherein the one of the plurality of primary register circuits is a last one of the plurality of primary register circuits, and wherein the one of the plurality of redundant register circuits is a first one of the plurality of redundant register circuits.

6. The serially programmable IC of claim 3, wherein the plurality of primary register circuits are daisy-chained together, and wherein the redundant register circuits are daisy-chained together, the primary input terminal of one of the plurality of primary register circuits being coupled to the redundant output terminal of one of the plurality of redundant register circuits.

7. The serially programmable IC of claim 4, wherein each of the primary register circuits further comprises a primary multiplexer control circuit coupled to the primary multiplexer control terminal, and wherein each of the redundant register circuits further comprises a redundant multiplexer control circuit coupled to the redundant multiplexer control terminal.

8. The serially programmable IC of claim 7, wherein the primary multiplexer control circuits and the redundant multiplexer control circuits comprise non-volatile programmable circuits.

9. The serially programmable IC of claim 7, further comprising an output control circuit for reading a data word out of the memory array, the output control circuit comprising:

a defective address circuit for identifying primary column groupings that include defective columns and redundant column groupings that contain stored data;

a redundant output control circuit for shifting data out of redundant column groupings identified by the defective address circuit as containing stored data; and a primary output control circuit for shifting data out of primary column groupings not identified by the defective address circuit as including defective columns.

10. The serially programmable IC of claim 9, wherein the primary output control circuit comprises:

a plurality of primary sense amplifiers;

a column select circuit for coupling the plurality of primary sense amplifiers to selected primary columns in the memory array;

a plurality of primary data latches for latching data sensed by the plurality of primary sense amplifiers; and a primary bit shifting multiplexer for serially shifting out data latched in the plurality of primary data latches.

11. The serially programmable IC of claim 10, wherein the plurality of primary data latches have a total width equal to a second width, and wherein the column select circuit comprises a column address generator for generating a sequence of column addresses, each of the column addresses corresponding to a portion of the primary columns, the portion of the primary columns having the second width.

12. The serially programmable IC of claim 11, wherein the plurality of primary data latches are organized into primary latch groupings, each of the primary latch groupings having the first width, and wherein the primary bit shifting multiplexer comprises:

a plurality of primary pass transistor pairs, each of the primary pass transistor pairs including a first pass transistor and a second pass transistor serially coupled between one of the plurality of primary data latches and an output terminal of the serially programmable IC, the plurality of primary pass transistor pairs being organized into a plurality of primary pass transistor groupings, each of the primary pass transistor groupings being associated with one of the primary latch groupings;

a shifting signal generator for generating a repeating cycle of shifting signals, each of the shifting signals turning on one of the second pass transistors in each of the primary pass transistor groupings;

a word address generator for generating a sequence of word addresses, each of the word addresses corresponding to one of the plurality of primary latch groupings, the word address generator incrementing the word address after each cycle of the shifting signals; and a first binary decoder for decoding the word address into a word select signal, the word select signal turning on the first pass transistor for all pass transistor groupings associated with one of the plurality of primary latch groupings.

13. The serially programmable IC of claim 12, wherein the defective address circuit includes a plurality of defective address memories for storing the location of primary column groupings that include defective columns, each location being based on a predetermined column address and a predetermined word address, and wherein the word address generator comprises a checking circuit for performing a bypass operation on an upcoming one of the sequence of column addresses and an upcoming one of the sequence of word addresses, the bypass operation comprising instructing the word address generator to bypass the upcoming one of the sequence of word addresses when the upcoming one of the word addresses matches the predetermined row address and the upcoming one of the sequence of column addresses matches the predetermined column address.

14. The serially programmable IC of claim 13, wherein the checking circuit performs the bypass operation during each cycle of the shifting signals, and wherein the checking circuit completes each bypass operation within a single cycle of the shifting signals.

15. The serially programmable IC of claim 13, wherein the redundant output control circuit comprises:

a plurality of redundant sense amplifiers;

a plurality of redundant data latches for latching data sensed by the plurality of redundant sense amplifiers;

a redundant bit shifting multiplexer for serially shifting out data from the plurality of redundant data latches.

16. The serially programmable IC of claim 15, wherein the plurality of redundant data latches are organized into redundant latch groupings, each of the redundant latch groupings having the first width, wherein the redundant bit shifting multiplexer comprises a plurality of redundant pass transistor pairs, each of the redundant pass transistor pairs including a first redundant pass transistor and a second redundant pass transistor serially coupled between one of the plurality of redundant latches and the output terminal of the serially programmable IC, the plurality of redundant pass transistor pairs being organized into a plurality of redundant pass transistor groupings, each of the redundant pass transistor groupings being associated with one of the redundant latch groupings, wherein each of the shifting signals from the shifting signal generator turns on one of the second redundant pass transistors in each of the redundant pass transistor groupings, and wherein each of the defective address memories includes a redundancy enable bit for identifying redundant pass transistor groupings associated with redundant column groupings having stored data, the redundant bit shifting multiplexer comprising a redundancy read circuit for generating a sequence of redundant column enable signals, each of the sequence of redundant column enable signals turning on all the first redundant pass transistors for one of the redundant pass transistor groupings.

17. A serially programmable integrated circuit (IC) comprising:

a memory array including primary columns organized into primary column groupings having a first width and redundant columns organized into redundant column groupings having the first width;

a plurality of primary data registers having the first width, the plurality of primary data registers being daisy-chained by primary register bypass logic, the primary register bypass logic selectively including or bypassing the primary data registers in a serial programming path for the IC;

a plurality of redundant data registers having the first width, the plurality of redundant data registers being daisy-chained by redundant register bypass logic, the redundant register bypass logic selectively including or bypassing the redundant data registers in the serial programming path; and a bitline latch, the bitline latch comprising a plurality of primary latch groupings and a plurality of redundant latch groupings, each of the primary latch groupings having the first width, each of the primary latch groupings being associated with one of the plurality of primary data registers and one of the plurality of primary column groupings, and each of the redundant latch groupings having the first width, each of the redundant latch groupings being associated with one of the plurality of redundant data registers and one of the plurality of redundant column groupings.

18. The serially programmable IC of claim 17, wherein the primary register bypass logic and the redundant register bypass logic comprise non-volatile programmable logic for bypassing or including the primary data registers and the redundant data registers, respectively, in the serial programming path.

19. The serially programmable IC of claim 18, further comprising means for reading a data word out of the memory array, the means for reading the data word comprising:

means for identifying primary column groupings that include defective columns and redundant column groupings that contain stored data;

means for shifting a first portion of the data word out of the redundant column groupings that contain stored data; and means for shifting a second portion of the data word out of the primary column groupings that do not include defective columns.

20. The serially programmable IC of claim 19, wherein the IC comprises an output terminal, and wherein,the means for identifying comprises means for storing a plurality of redundancy column indicators, each of the redundancy column indicators identifying a redundant column grouping that contains stored data, and wherein the means for shifting the first portion of the data word out of the redundant column groupings comprises:

means for latching data from the redundant column groupings into a plurality of redundant data latches, the redundant data latches organized into a plurality of redundant output latch groupings, each of the redundant output latch groupings being associated with one of the redundant column groupings;

means for generating a bit shifting signal; and means for sequentially shifting data out from the redundant output latch groupings associated with redundant column groupings identified by the redundancy column indicators to the output terminal in response to the bit shifting signal.

21. The serially programmable IC of claim 20, wherein the means for identifying further comprises means for storing a plurality of defect addresses, each of the defect addresses identifying a primary column grouping that includes defective columns, and wherein the means for shifting the second portion of the data word out of the primary column groupings comprises:

means for assigning a local address to each of the plurality of primary column groupings;

means for latching data from the primary column groupings into a primary bitline latch;

means for sequentially shifting data out from the primary output latch groupings to the output terminal in response to the bit shifting signal, the means for sequentially shifting data out from the primary output latch groupings comprising means for bypassing data from primary column groupings having local addresses that match any of the defect addresses.

22. The serially programmable IC of claim 21, wherein the means for bypassing data comprises lookahead means for detecting and bypassing primary column groupings having local addresses that match any of the defect addresses before the means for sequentially shifting data out from the primary output latch groupings attempts to shift data out from the primary column groupings having local addresses that match any of the defect addresses.

23. A method for configuring an integrated circuit (IC) comprising:

testing a plurality of primary column groupings in a memory array in the IC to detect defective columns;

programming a bypass logic circuit to bypass one or more primary data registers in a serial programming path, wherein each of the one or more primary data registers bypassed by the bypass logic circuit is associated with a primary column grouping including a defective column;

programming the bypass logic circuit to incorporate one or more redundant data registers in the serial programming path for each of the one or more primary data registers bypassed by the bypass logic circuit, wherein each of the one or more redundant data registers is associated with a redundant column grouping in the memory array;

serially shifting data into the primary data registers and redundant data registers in the serial programming path; and loading data from the primary data registers and the redundant data registers in the serial programming path into the memory array in parallel.

24. The method of claim 23, further comprising:

programming a defective address into an output control circuit of the IC for each of the primary data registers bypassed by the bypass logic circuit; and programming a redundancy enable indicator into the output control circuit for each of the redundant data registers incorporated into the serial programming path by the bypass logic circuit.

25. A method for programming a serially programmable integrated circuit (IC), the IC comprising an input terminal, a plurality of primary data registers, a plurality of redundant data registers, a bitline latch, and a memory array including a plurality of primary column groupings and a plurality of redundant column groupings, each of the plurality of primary column groupings being coupled to receive programming data from one of the plurality of primary data registers bit the bitline latch, and each of the plurality of redundant column groupings being coupled to receive programming data from one of the plurality of redundant data registers via the bitline latch, the method comprising:

shifting a programming bitstream into the primary data registers through the input terminal;

bypassing primary data registers associated with primary column groupings that include defective columns;

shifting the programming bitstream into the redundant data registers until the programming bitstream is completely shifted through the input terminal;

latching data from the primary data registers and redundant data registers into the bitline latch; and programming data from the bitline latch into the memory array.

* * * * *